United States Patent [19]

Hirokawa et al.

[11] Patent Number: 4,588,342
[45] Date of Patent: May 13, 1986

[54] IC MAGAZINE SUPPLY SYSTEM

[75] Inventors: Hideo Hirokawa, Odawara; Seiji Kazama, Hadano; Hisashi Takashima, Kanagawa, all of Japan

[73] Assignee: Hitachi Electronics Engineering Co., Ltd., Kanagawa, Japan

[21] Appl. No.: 520,688

[22] Filed: Aug. 5, 1983

[30] Foreign Application Priority Data

Aug. 13, 1982 [JP] Japan .................. 57-139946

[51] Int. Cl.$^4$ ............................................ B65G 59/06
[52] U.S. Cl. .................... 414/125; 414/750; 221/103
[58] Field of Search ............... 414/125, 126, 114, 32, 414/76, 82–85, 750; 29/739–741, 759; 221/103, 104, 106, 107, 110, 266; 198/347, 366, 368, 774, 451

[56] References Cited

U.S. PATENT DOCUMENTS

| 1,880,112 | 9/1932 | Shmyroff et al. | 198/774 |
| 1,925,676 | 9/1933 | Richardson | 221/110 |
| 3,040,934 | 6/1962 | Weiner | 221/106 |
| 3,294,259 | 12/1966 | Puhm | 414/126 |
| 4,073,373 | 2/1978 | Crowley et al. | 198/421 |
| 4,294,347 | 10/1981 | Furlette et al. | 198/774 |
| 4,407,405 | 10/1983 | Rise | 198/774 |
| 4,407,406 | 10/1983 | Norris | 198/774 |

FOREIGN PATENT DOCUMENTS

| 0052824 | 4/1980 | Japan | 414/125 |
| 0028123 | 3/1981 | Japan | 414/114 |

Primary Examiner—Leslie J. Paperner
Assistant Examiner—Lyle Kim
Attorney, Agent, or Firm—Antonelli, Terry & Wands

[57] ABSTRACT

An IC magazine supply system including a plurality of rows of side by side magazine stackers each holding a vertical stack of IC magazines each holding an array of IC packages therein, guide bars located beneath the magazine stackers for receiving the IC magazines as they move downwardly, a moving section receiving the IC magazines when it moves downwardly, moving transversely while holding the IC magazines, discharging the IC magazine located at a leading end while transferring the rest of the IC magazines to the guide bars and thereafter moving transversely in an opposite direction, and a plurality of sensors mounted on the bottom of each one of the plurality of rows of magazine stackers for sensing the condition of movement of the IC magazines. The guide bars and the moving section are each formed with a plurality of pairs of recesses for holding the IC magazines, and the moving section moves repeatedly in a rectangular movement to enable the IC magazines to be successively supplied from the magazine stackers.

10 Claims, 12 Drawing Figures

IC MAGAZINE SUPPLY SYSTEM

BACKGROUND OF THE INVENTION

This invention relates to an IC magazine supply system, and more particularly it is concerned with an IC magazine supply system capable of automatically supplying IC magazines to an IC handler and discharging same therefrom by means of magazine stackers which may be located in an IC inlet section or an IC outlet section of the IC handler.

After IC chips are molded into packages and their appearance is tidied, the packages are placed in IC magazines (hereinafter magazines, for short) for ease of handling in the plants of IC makers. This is because supplying the chips to the IC handler for automatic inspection and discharging same therefrom after the inspection is finished are facilitated when the packages are of the DIP type and have connecting pins arranged on both sides thereof, if the packages are arranged in magazines on a slide way of the straddling type.

It has hitherto been practiced to supply the magazines to an IC handler by using a magazine supply system with a single magazine stacker arranged in an IC feeding section (for receiving the magazines holding IC packages therein) of an IC handler or an IC discharging section (for receiving magazines holding no IC packages therein) thereof. Such magazine stacker is operative to stack a multiplicity of magazines in a vertical direction in a stack and provided on its bottom with means for taking the magazines out of the magazine stacker one after another and allowing same to move downwardly. In the prior art, a single row of magazine stacker is used and this arrangement has had some problems. One of them is that when the time required for inspecting each IC chip is short, feeding of the magazines to the IC handler or stacker might not be able to keep pace with an inspection performed in the IC handler if the IC packages are contained in a small number in one magazine. When they have a large number of pins and their package length is longer, only a small number of packages can be contained in one magazine, and a similar problem may be recognized. Thus the IC handler might often become idle during an inspection operation on account of no IC chips being supplied to the IC handler from the magazine stacker, thereby reducing the efficiency with which inspection is carried out by the IC handler.

SUMMARY OF THE INVENTION

This invention has been developed for the purpose of obviating the aforesaid disadvantage of the prior art. Accordingly, the invention has as its object the provision of an IC magazine supply system wherein the magazine stacking capacity of a mechanism for supplying magazines to an IC inlet section or an IC outlet section of an IC handler is improved to increase the intervals of time at which the magazines are fed to the mechanism and reduce the number of times required for feeding the magazines to the mechanism, and wherein the magazines stacked by the mechanism can be supplied one after another to the IC handler in a predetermined order in a controlled manner so as to thereby facilitate feeding of the magazines in large numbers to the mechanism for supplying the magazines to the IC handler.

To accomplish the aforesaid object, the invention provides an IC magazine supply system comprising a plurality of rows of magazine stackers serving as a mechanism for supplying the magazines to an IC handler which are arranged in side-by-side relation and located either in an IC inlet section of the IC handler or an IC outlet section thereof, guide means located beneath the rows of stackers for receiving the magazines as they move downwardly, a moving section capable of moving in rectangular movement in an upward direction, a transverse direction, a downward direction and a reverse transverse direction, and sensors each mounted on the bottom of one of the rows of magazine stackers for sensing the condition of movement of the magazines, whereby the magazines can be supplied one after another from the plurality of rows of magazine stacker to the IC handler.

DESCRIPTION OF THE PREFERRED EMBODIMENT

Figure 1:
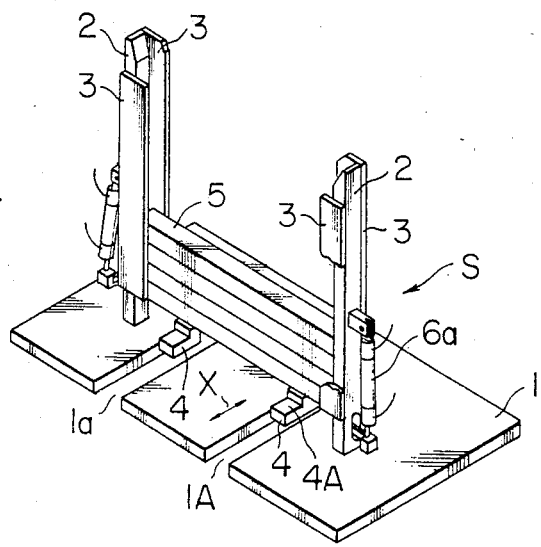
FIG. 1 is a perspective view of an IC magazine supply system of the prior art.
Figure 2A:
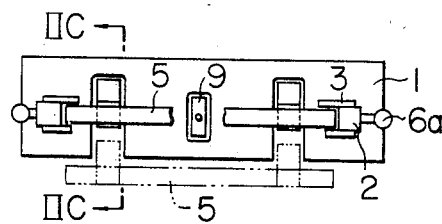
FIG. 2A is a plan view of the system shown in FIG. 1.
Figure 2C:
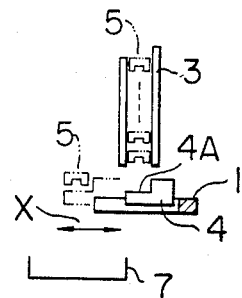
FIG. 2C is a sectional view taken along the line IIC—IIC in FIG. 2A.
Figure 2B:
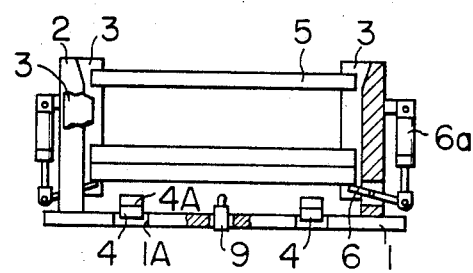
FIG. 2B is a front view, with certain parts being cut out, of the system shown in FIG. 1.

Before describing in detail the preferred embodiment of the invention shown in the drawings, the prior art will be outlined.

Referring to FIGS. 1, 2A, 2B and 2C, an IC magazine supply system of the prior art comprises a single magazine stacker S. As shown, the magazine stacker S comprises a base 1, posts 2 for supporting magazines 5 stacked in the stacker S, side plates 3 each attached to one of the posts 2, a moving section 4 capable of moving in a transverse direction, a pair of claws 6 for taking one magazine 5 after another out of the stack of magazines 5 and allowing same to move downwardly, a pair of hydraulic cylinders 6a each for operating one of the claws 6, a magazine box 7 for receiving the magazines 5 discharged from the magazine stacker S, and a sensor 9 for sensing the condition of movement of the magazines 5. In the IC magazine supply system of the aforesaid construction of the prior art, the claws 6 are operated as the hydraulic cylinders 6a are actuated to move the lowest magazine 5 from the stack of magazines 5 into slot 4A formed in the moving section 4, which moves along grooves 1A in a transverse direction as indicated by arrows X in FIGS. 1 and 2C, to thereby discharge the magazine 5 from the magazine stacker S into the magazine box 7 shown in FIG. 2C by a mechanism, not shown.

In the system of the prior art shown and described hereinabove, the magazine stacker S is only one in number and its height cannot be increased much. Thus this sytem has suffered the disadvantage that the magazines 5 should be fed at short intervals of time.

FIGS. 3, 4A, 4B and 4C show one embodiment of the IC magazine supply system in conformity with the invention which comprises three rows of magazine stackers $S_1$, $S_2$ and $S_3$, for example, which commonly comprise a pair of guide bars 8, and a pair of stoppers 10 for preventing the movement of the magazines in a longitudinal direction which are secured to the guide bars 8 or the base 1. A moving section 14 is formed with three pairs of slots 14A, 14B and 14C so as to be able to convey three magazines 5 at a time. The moving section 14 and other parts of the system are controlled by a microprocessor, not shown. Sensors 9 are provided each on the bottom of one of the magazine stackers $S_1$, $S_2$ and $S_3$, and an input signal is supplied to the microprocessor when the magazine 5 is supplied from a certain one of the magazine stackers $S_1$, $S_2$ and $S_3$. A multiplicity of sensors, including a sensor for checking on a supply of IC packages to the IC handler from the magazines 5 and a sensor for checking on a discharge of IC packages from the IC handler to the magazines 5, are mounted in addition to the sensors 9, to monitor the movement of the IC packages, the movement of the magazines 5 and the operation of various parts of the IC magazine supply system. Signals produced by these sensors as a result of monitoring the operations are supplied to a read-only memory (ROM) linked to the microprocessor which stores an arbitrarily selected control program, so that it is possible to effect control of the operations of the IC magazine supply system as a whole. In the embodiment shown and described hereinabove, it is possible to decide by means of the control program how the magazines should be supplied to the IC handler from the magazine stackers. Generally speaking, however, it would be advantageous to start supplying the magazines from the row of the stacker disposed nearest the operator and shift successively to the second and third rows of stackers away from the operator, from the point of view of increasing the efficiency with which the magazines 5 are supplied to the IC handler.

Figure 3:
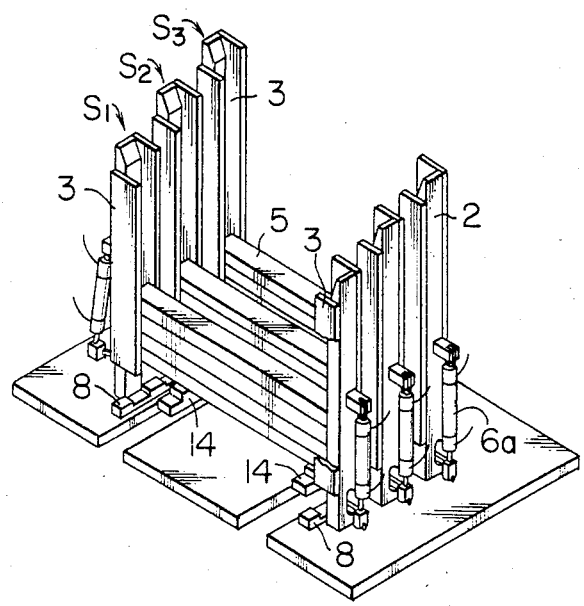
FIG. 3 is a perspective view of one embodiment of the IC magazine supply system according to the invention.
Figure 4A:
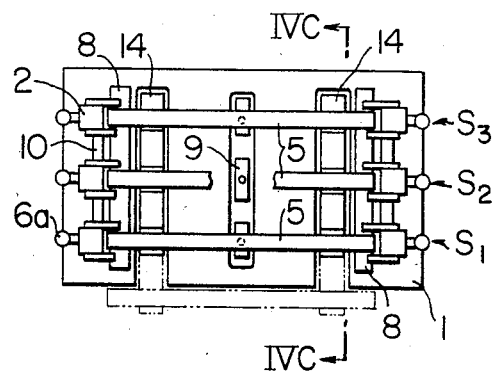
FIG. 4A is a plan view of the embodiment shown in FIG. 3.
Figure 4C:
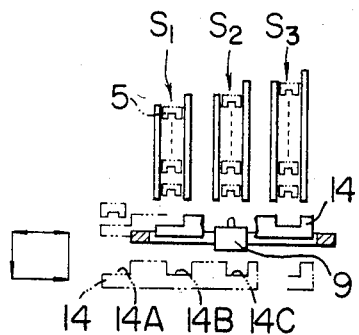
FIG. 4C is a sectional view taken along the line IVC—IVC in FIG. 4A.
Figure 4B:
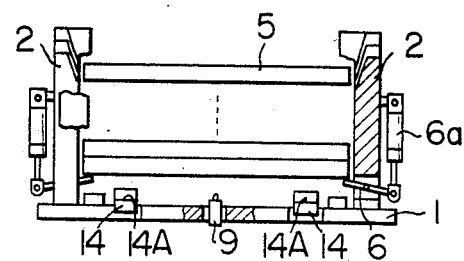
FIG. 4B is a front view, with certain parts being cut out; of the embodiment shown in FIG. 3.
Figure 5A:
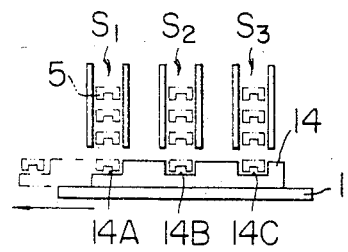
FIGS. 5A-5D are views showing the manner of operation of the moving section of the embodiment shown in FIG. 3.
Figure 5B:
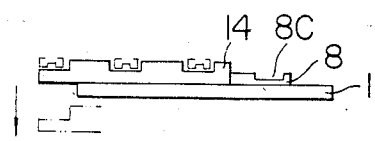
Figure 5C:
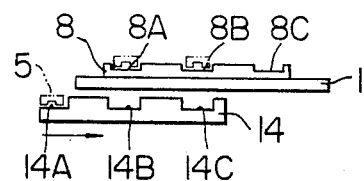
Figure 5D:
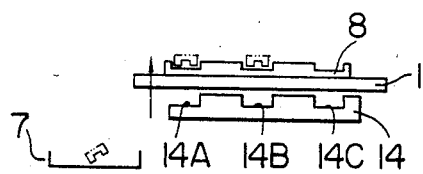

Operation of the IC magazine supply system of the construction according to the invention shown in FIG. 3 will be described by referring to FIGS. 5A-5D. The magazines 5 fed to the magazine stackers $S_1$, $S_2$ and $S_3$ are placed in three pairs of slots 14A, 14B and 14C formed in the moving section 14 which moves to an upper position shown in FIG. 5A. The guide bars 8 are also formed with three pairs of slots 8A, 8B and 8C. When the moving section 14 is in its raised position and the slots 14A-14C and 8A-8C are in the condition shown in FIG. 5A, the bottom surface of each of the slots 14A-14C is higher than the top surface of ridges between the adjacent slots 8A-8C of the guide bars 8, to allow the magazines 5 to move freely in the transverse direction. Then the moving section 14 moves transversely toward the left end while holding three magazine 5 thereon as shown in FIG. 5B, and thereafter the moving section 14 moves downwardly after leaving two magazines 5 in the slots 8A and 8B of the guide bars 8 as shown in FIG. 5C. The moving section 14 holding the single magazine 5 in the slots 14A discharges this magazine 5 into the magazine box 7 and moves transversely until it reaches a right end as shown in FIG. 5D. Then the moving section 14 moves upwardly to the upper position shown in FIG. 5A and the magazines 5 held in the slots 8A and 8B of the guide bars 8 are transferred to the moving section 14 simultaneously as one magazine 5 is discharged from the magazine stacker $S_3$ to the slot 14C of the moving section 14. Thus the magazines 5 in the stacker $S_3$ show a reduction in number but there is no change in the number of magazines 5 in the magazine stackers $S_1$ and $S_2$. In this way, when all the magazines 5 in the stacker $S_3$ are discharged into the magazine box 7, the magazines are successively supplied to the moving section 14 from the other two stackers $S_2$ and $S_1$.

From the foregoing description, it will be appreciated that although the stroke of the transverse movement of the moving section 14 is equal to the spacing interval between the adjacent rows of stackers $S_1$, $S_2$ and $S_3$, and the magazines 5 are supplied successively and intermittently from the stacker $S_3$ in the direction of the stacker $S_1$ with the slots 8A-8C of the guide bars 8 serving as relay points.

When the magazines 5 are taken one after another out of the lower portion of each of the magazine stackers $S_1$, $S_2$ and $S_3$, an impact which might be given to the system in a vertical direction could be reduced by using a "SYSTEM FOR SEPARATELY FEEDING IC MAGAZINES" disclosed in Japanese Utility Model Laid-Open No. 60619/83 filed by the same applicant of this application.

In the embodiment shown and described hereinabove, three rows of stackers $S_1$, $S_2$ and $S_3$ have been described as being used in the IC magazine supply system. However, the invention is not limited to this specific number of magazine stackers and it will be appreciated that any number of rows of magazine stackers, two or more than two, may be used as desired without departing from the scope of the invention.

The IC magazine supply system shown and described hereinabove according to the invention is capable of avoiding the risk of an IC chip inspecting operation performed by an IC handler being interrupted on account of the supply of the magazines to the IC handler being delayed and unable to keep pace with the inspecting operation, thereby facilitating the production of the IC packages on a mass production basis.

What is claimed is:

1. An IC magazine supply system for supplying IC magazines to an IC inlet section or an IC outlet section of an IC handler, each said IC magazine holding an array of IC packages therein, comprising:

a plurality of magazine stackers arranged in parallel with a predetermined distance therebetween, each of said magazine stackers being capable of holding a plurality of said IC magazines stacked in a vertical direction, one of said magazine stackers disposed on an operator side supplying its IC magazines in preference to the other magazine stackers;

guide means located under said plurality of magazine stackers for receiving an IC magazine from a selected one of said IC magazine stackers;

a moving section movable vertically and transversely for moving upwardly to an upper position thereof above said guide means to receive the IC magazines from said guide means, for moving said predetermined distance in a first transverse direction to discharge the IC magazine at a leading end thereof, and for moving in a second transverse direction opposite said first direction for said predetermined distance;

a plurality of sensors each mounted on the bottom of one of said plurality of magazine stackers for sensing the condition of movement of the IC magazines, whereby the IC magazines can be supplied successively in order, from a plurality of stackers so that when one of the stacker is depleted, it can be filled while IC magazines are continuously supplied to said guide means from other one of the stackers.

2. An IC magazine supply system as claimed in claim 1, wherein said moving section and said guide means are each formed with a plurality of pairs of slots for holding the IC magazines.

3. An IC magazine supply system as claimed in claim 1 or 2, wherein said moving section moves repeatedly in a rectangular movement.

4. An IC magazine supply system for supplying IC magazines to an IC inlet section or an IC outlet section of an IC handler, each of said IC magazines holding an array of IC packages therein, comprising:

a plurality of magazine stackers arranged in spaced relationship adjacent one another at a predetermined space interval, each of said magzine stackers being capable of holding a plurality of said IC magazines stacked in vertical direction, one of said magazine stackers disposed on an operator side supplying its IC magazines in preference to the other magazine stackers;

a guide means having a plurality of holding portions each of which corresponds to a respective one of said magazine stackers for receiving an IC magazine from said respective magazine stacker;

a moving section movable vertically and transversely for moving upwardly to an upper position thereof above said guide means to receive the IC magazines from said guide means, for transversely moving to a forward position to discharge the IC magazine at a leading end thereof, and for moving transversely to a retracted position thereof; said predetermined space interval being equal to the distance between said forward and retracted positions;

a plurality of sensors each mounted on the bottom one of said plurality of magazine stackers for sensing the condition of movement of the IC magazines, whereby the IC magazines can be supplied successively in order, from a plurality of stackers so that when one of the stacker is depleted, it can be filled while IC magazines are continuously supplied to said guide means from other one of the stackers.

5. An IC magazine supply system as claimed in claim 4, wherein said moving section, while returning from said forward position to said retracted position, discharges the IC magazine therefrom.

6. An IC magazine supply system as claimed in claim 4, wherein said moving section moves from the retracted position to the forward position while being held in the upper position, and wherein said moving section moves downwardly and then discharges the IC magazine therefrom when returning from the forward position to the retracted position.

7. An IC magazine supply system as claimed in claim 4, wherein said moving section moves from the retracted position to the forward position in the upper position, and wherein the IC magazines in a particular one of said magazine stackers on the retracted position side are discharged onto said guide means in preference to the IC magazines in the other magazine stackers, said retracted position side being said operative side.

8. An IC magazine supply system for supplying IC magazines to an IC inlet section or an IC outlet section of an IC handler, each of said IC magazines holding an array of IC packages therein, comprising:

a plurality of rows of magazine stackers in side-by-side relation with a predetermined distance therebetween, each of said magazine stackers being capable of holding a plurality of said IC magazines stacked in a vertical direction, one of said magazine stackers disposed on an operator side supplying its IC magazines in preference to the other magazine stackers;

guide means located under the magazine stackers and having a plurality of slots therein, said slots being adapted for receiving the IC magazines from a selected one of said magazine stackers and being associated with the corresponding magazine stackers;

a means for moving said IC magazines, movable vertically and transversely for moving upwardly to an upper position thereof above said guide means to receive the IC magazines from said guide means, for moving said predetermined distance in a first tranverse direction from a retracted position to a forward position to discharge the IC magazine at a leading end thereof, and for moving in a second transverse direction opposite said first direction for said predetermined distance when said means for moving said IC magazines is in a lower position; and a plurality of sensors each mounted on the bottom one of said plurality of rows of magazine stackers for sensing the condition of movement of the IC magazines, whereby the IC magazines can be supplied succesively in order, from a plurality of stackers so that when one of the stacker is depleted, it can be filled while IC magazines are continuously supplied to said guide means from other one of the stackers.

9. An IC magazine supply system as claimed in claim 8, wherein said means for moving said IC magazines moves from the forward position to the retracted position while being held in the upper position, and wherein said means for moving said IC magazines discharges the IC magazine therefrom when returning from the forward position to the retracted position.

10. An IC magazine supply system as claimed in claim 8, wherein said means for moving said IC magazines moves from the retracted position to the forward position in the upper position, and wherein the IC magazines in a particular one of said magazine stackers on the retracted position side are discharged onto said guide means in preference to the IC magazines in the other magazine stackers, said retracted position side being said operator side.

* * * * *